United States Patent [19]
Sadamasa et al.

[11] 4,145,707
[45] Mar. 20, 1979

[54] SEMICONDUCTOR LUMINESCENT DISPLAY APPARATUS

[75] Inventors: Tetsuo Sadamasa, Tokyo; Makoto Naito, Kamakura; Tadao Nakamura, Tokyo, all of Japan

[73] Assignee: Tokyo Shibaura Electric Co., Ltd., Kawasaki, Japan

[21] Appl. No.: 803,984

[22] Filed: Jun. 6, 1977

[30] Foreign Application Priority Data

| | | |
|---|---|---|
| Jun. 4, 1976 [JP] | Japan | 51-65212 |
| Jun. 4, 1976 [JP] | Japan | 51-65213 |
| Feb. 3, 1977 [JP] | Japan | 52-10290 |
| Feb. 7, 1977 [JP] | Japan | 52-12222 |

[51] Int. Cl.² .............. H01L 23/48; H01L 29/44; H01L 29/52
[52] U.S. Cl. .............. 357/68; 357/17; 357/70; 357/65
[58] Field of Search ............ 357/17, 68, 70, 65

[56] References Cited
U.S. PATENT DOCUMENTS

| | | | |
|---|---|---|---|
| 3,882,532 | 5/1975 | Quinn | 357/68 |
| 3,893,150 | 7/1975 | Dubois | 357/68 |
| 4,047,219 | 9/1977 | Temple | 357/68 |
| 4,060,826 | 11/1977 | Voss | 357/68 |

OTHER PUBLICATIONS

IBM Technical Disclosure Bulletin, by Rideout et al., vol. 10, No. 12, May 1968, p. 1975.
IBM Technical Disclosure Bulletin, by Parslow, vol. 11, No. 7, Dec. 1968, p. 850.

*Primary Examiner*—Andrew J. James
*Attorney, Agent, or Firm*—Oblon, Fisher, Spivak, McClelland & Maier

[57] ABSTRACT

A semiconductor luminescent display apparatus includes a plurality of semiconductor luminescent devices arranged in a row on a header. The device includes a luminescent segments arranged in a letter of eight and electrodes each having a contact surface in contact with one end side of the luminescent surface of the segments in the longitudinal direction thereof.

7 Claims, 4 Drawing Figures

SEMICONDUCTOR LUMINESCENT DISPLAY APPARATUS

BACKGROUND OF THE INVENTION

This invention relates to a semiconductor luminescent display apparatus having a planar structure and, more particularly, to a display apparatus suited to such purpose as viewing small characters or figures on an enlarged scale as the display in a camera finder.

The monolithic luminescent display apparatus having a planar structure has already been in practical use in various fields. For example, in application to the numerical display apparatus there is known one in which seven rectangular luminescent segments individually having a p-n junction formed by selective diffusion of impurity into a semiconductor substrate are arranged in the figure of eight and are adapted to be driven for displaying a desired figure.

In such prior art apparatus, an electrode extending in the longitudinal direction is provided on a central portion of the top of each segment in order to obtain efficient luminescence of the element. Therefore, a pattern of light emitted from the segment is blocked at the central portion thereof by the electrode. Although the formation of such electrode does not substantially give rise to practical problem but only leads to slight reduction of the intensity of the central portion of a light pattern produced from the segment, in such case as in the display in a camera finder, for instance, where figures to be displayed are as small as about 1mm and are viewed by enlarging them, a shade formed in the central portion of the luminescent segment obstructs the view very much to deteriorate the appearance.

SUMMARY OF THE INVENTION

Accordingly, an object of the invention is to provide a semiconductor luminescent display apparatus, which is suited to the display of as small characters and figures as the extent requiring the enlargement of the display scale, and with which the appearance and clarity of the luminescent display surface are improved.

BRIEF DESCRIPTION OF THE DRAWING

FIGS. 1 to 3 show an embodiment of the semiconductor luminescent display apparatus according to the invention, in which FIG. 1 is a plan view of part of the apparatus, FIG. 2 is a plan view showing part of the apparatus of FIG. 1, and FIG. 3 is a sectional view taken along line 3—3 in FIG. 2.

DETAILED DESCRIPTION OF THE PREFERRED EMBODIMENTS

A semiconductor luminescent display apparatus embodying the invention applied to gallium phosphide green luminescent display apparatus will now be described with reference to the accompanying drawings.

Figure 1:
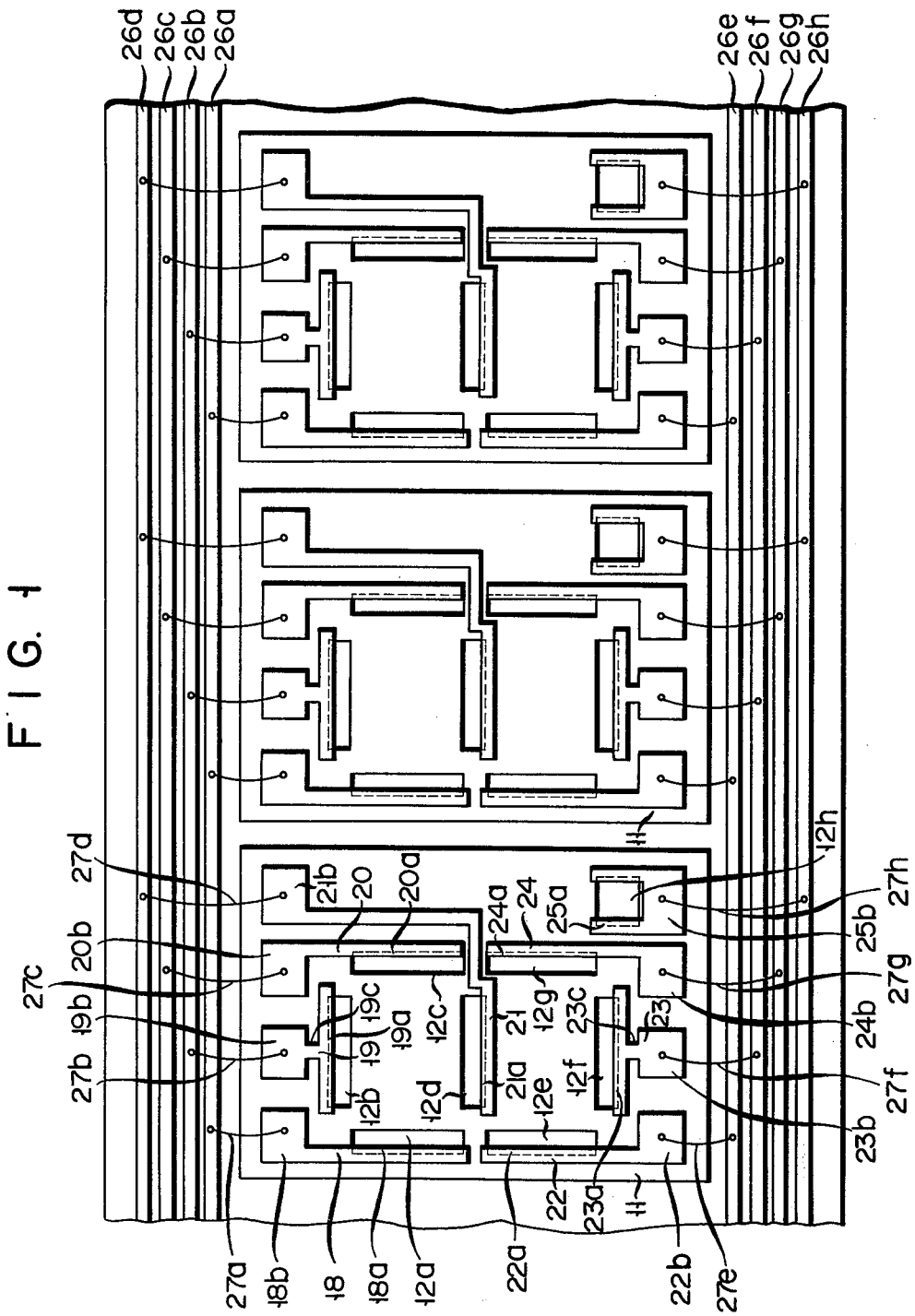

The apparatus shown in FIG. 1 displays three-digit figures, and it comprises three semiconductor devices 11 arranged in a row on the top face of a common insulating header 10. Each section 11 includes seven rectangular luminescent segments 12a to 12g arranged such as to represent a figure eight, with the first to fourth segments 12a to 12d arranged in a form like a square frame and fourth to seventh segments 12d to 12g arranged to form a square frame.

Each semiconductor device 11 is formed in the manner as described in the following.

Zinc is selectively diffused into an n-type gallium phosphide substrate 13 (GaP substrate) doped with sulfur and nitrogen from the top of the substrate to form p-type diffusion layers 14, each with a p–n junction 15 defined between the substrate 13 and diffusion layer 14. At the time of this zinc diffusion, a silicon nitride film 16 is used as a mask, which is subsequently left as protective film. An example of this method will now be described. The silicon nitride film 16 is formed to a thickness of about 2,000Å by a so-called CVD method where silane gas and ammonia gas are reacted together at a temperature of about 680° C. Then, windows are selectively formed in it, and then zinc is diffused under conditions of 650° C. and 15 hours to form the p-type diffusion layers 14 of a strip-like form to a depth of about 5μ. This diffusion layer defines a substantially rectangular luminescent surface. Subsequently, the back side of the substrate 13 is polished by more than 5μ to adjust the substrate to a suitable thickness, and then silicon and a silicon-gold alloy with 2 wt.% silicon and gold are deposited in the mentioned order on the polished surface to form an n-type conductivity side electrode 17. Meanwhile, a gold-beryllium alloy with 1 wt.% beryllium and gold are deposited in the mentioned order to a thickness of about 1μ on the side of the GaP substrate 13 formed with p-type diffusion layer 14 and are selectively etched to form p-type conductivity side electrodes 18 to 24 for the respective luminescent segments 12a to 12g as shown in FIG. 1.

The first, third, fifth and seventh p-conductivity side electrodes 18, 20, 22 and 24 are provided with respective contact portions 18a, 20a, 22a and 24a having contact surfaces in contact with the entire area of the longitudinal outer end of these layers and extend along the longitudinal direction of the luminescent surface of the p-type layers 14 and lead take-out portions 18b, 20b, 22b and 24b connected to the ends of the contact portions disposed on longitudinal end sides of the substrate 13. The second and sixth p-conductivity electrodes 19 and 23 provided on the second and sixth luminescent segments 12b and 12f extending in the transversal direction of the substrate 13 between the first and third luminescent segments 12a and 12c and between fifth and seventh luminescent segments 12e and 12g comprise respective contact portions 19a and 23a having contact surfaces extending in contact with the luminescent surfaces of these layers over the entire outer end of the luminescent segment, respective narrow neck sections 19c and 23c extending from the contact portions corresponding to the middle of the contact surfaces toward the respective longitudinal ends of the substrate 13 and lead take-out portions 19b and 23b connected to the other end of the respective neck portions 19c and 23c. The fourth p-conductivity side electrode 21 connected to the fourth luminescent segment 12d extending between the second and sixth luminescent segments 12b and 12f has a contact section 21a, which has an end contact surface in contact with the entire longitudinal end area of the luminescent surface of the segment and is connected at the other end to a lead take-out portion 21b arranged parallel to the lead take-out portions 18b to 20b of the first to third p-conductivity side electrodes 18 to 20. In the instant embodiment, the lead take-out sections of the first to seventh p-conductivity side electrodes 18 to 24 each have a rectangular form of substantially the same dimension. The first to fourth lead take-out sections 18b to 21b are arranged in a row, while the fifth to seventh lead take-out sections 22b to 24b are arranged in another row parallel to said row. These rows are arranged in the transversal direction of the substrate and at a predetermined distance between then, between which the aforesaid seven luminescent segments 12a to 12g are positioned.

A further luminescent segment 12h is provided on top of the semiconductor device 11 for the display of a decimal point, and an electrode 25 is connected to it. The electrode 25 has contact portions 25a extending along the opposite edges of the segment 12h, and a lead take-out section 25b disposed in alignment with the fifth to seventh electrode take-out portions 22b to 24b.

The semiconductor devices 11 of the above construction are mounted on the header 10 with the n-type conductivity side electrodes 17 directed downward. The electrodes 17 are connected to drive lines (not shown). First to eight conductive layers or drive lines 26a to 26h are mounted on the header 10 and extend along the transversal direction of the header and at a predetermined interval from one another. As is apparent from FIG. 1, the first to fourth conductive layers 26a to 26d are provided on one side of the substrate 11, while the fifth to eighth conductive layers 26e to 26h are provided on the other side of the substrate 11. These conductive layers 26a to 26h are connected to lead take-out sections 18b to 25b of the electrodes of the first to eighth luminescent segments by respective leads 27a to 27h which connect their respective parts with the respective shortest lengths.

Figure 2:
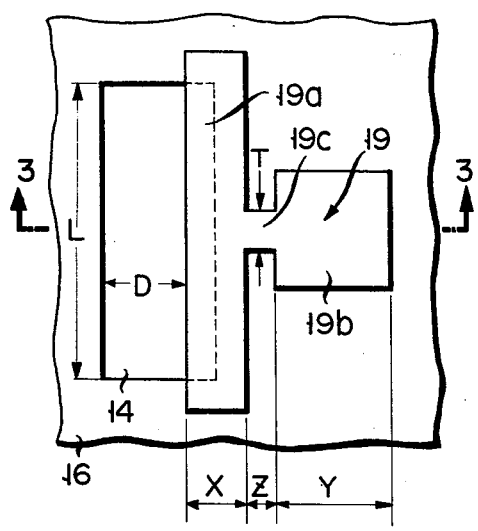
Figure 3:
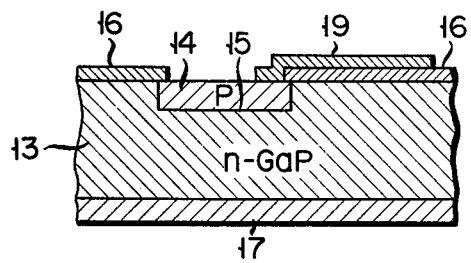
Figure 4:
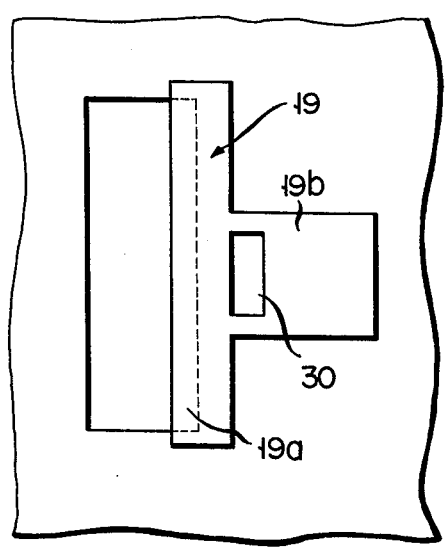
FIG. 4 is a plan view showing a modification of the electrode for a luminescent electrode.

The aforementioned second luminescent segment 12b (substantially the same as the sixth luminescent segment 12f) will now be described with reference to FIGS. 2 and 3.

The contact surface of the contact portion 19a of the electrode 19 in contact with one longitudinal end of the luminescent surface of the p-type diffusion layer 14 formed on the top of the semiconductor substrate 13 is preferably mounted such that the distance D between this one side and one side of the luminescent surface facing said side of the contact surface does not exceed 120μ. If this is exceeded, there is likely to cause irregularity in the intensity of luminescence of the pattern from the luminescent segment. The neck portion 19c connecting the part of the contact portion 19a and corresponding to the central portion of the contact surface and the lead take-out portion 19b desirably has a width T with a range $$1/100 < T/L < \frac{1}{4}$$

where L represents the total longitudinal length of the luminescent surface of the p-conductivity type diffusion layer 14. In the heat treatment step, it has been found that Ga element in the GaP layer 14 is absorbed or diffused into the contact portion, and the greater the quantity of absorption the less is the intensity of illumination. If T/L becomes greater than $\frac{1}{4}$, that is, if the neck portion is considerably broadened compared to the contact surface, Ga in the contact portion is noticeably diffused into the lead take-out portion. In such case, the aforementioned reduction of the intensity of illumination is likely to result due to absorption of a considerable quantity of the Ga element in the diffusion layer 14 into the lead take-out portion 19b via the contact portion 19a and neck portion 19c. Further, when T/L becomes less than 1/100, the neck portion is likely to be broken, causing damage to the element. The neck portion 19c is connected to the contact portion 19a corresponding to the central portion of the contact surface because otherwise with the absorption of the Ga element the concentration of the Ga element in the portion of the p-conductivity diffusion layer corresponding to the neck portion is reduced so that it becomes impossible to obtain satisfactory partial ohmic contact, giving rise to dark shade in the corresponding portion of the pattern. This effect can be minimized with the neck portion formed in the aforementioned position.

The means for suppressing the diffusion of Ga from the contact portion of the electrode to the lead take-out portion, such as the aforementioned neck portion, may have any suitable other form as well provided this function is met in effect. For example, it is possible to directly connect the contact portion 19a of the electrode 19 and lead take-out portion 19b thereof and provide a hole 30 in the neighborhood of the contact portion 19a of the take-out portion 19b to make the narrower passage of Ga.

As has been described in the foregoing, in the semiconductor luminescent display apparatus according to the invention the electrodes are arranged such that the contact portion of each electrode is in contact with one end of the luminescent surface of the corresponding luminescent segment, the central portion of the light pattern from the luminescent surface will not be concealed by the associated electrode. Consequently, the light pattern from the segment can be viewed very easily. In the embodiment shown in FIG. 1, the electrodes 19 and 23 of the second and sixth luminescent segments 12b and 12f are formed with the neck while providing no neck on the other electrodes. This is from the following reason, but of course it is possible to provide a neck to the other electrodes. The diffusion of the impurity such as Ga element from the p-conductivity type diffusion layer into the electrode presents problems where a lead take-out portion of a comparatively large area is connected to the side portion of the contact portion, but it does not present substantial problem in case of the other electrodes where a lead take-out portion is provided on the end of a long contact portion considerably spaced from the contact surface since in such case the impurity diffusion into the take-out portion is inhibited.

As is apparent from the Figure, the apparatus shown in FIG. 1 has an orderly arrangement as a whole so that it provides good appearance and is difficultly prone to such troubles as short-circuit and breakage. This is owing to the facts that the lead take-out portions of the electrodes are all arranged on opposite sides of the display pattern generating section constituted by the luminescent segments, that the conductive layers are arranged along and on opposite sides of the row of the semiconductor luminescent devices and that the lead take-out portion and conductive layer are connected together with lead wires as short as possible.

Instead of the GaP substrate it is possible to use for the semiconductor substrate other materials containing Ga such as GaAsP, GaAlAs, GaInP as well to obtain the same effects. Further, while in the above embodiment the luminescent segment is made of p-type diffusion layer and Au-Be alloy and Au for the electrode of the luminescent segment, it is also possible to use an n-type layer as the luminescent segment, and such material as AuSn, AuSi and AuGe can be effectively used for the electrode.

What we claim is:

1. A semiconductor luminescent display apparatus comprising a semiconductor substrate of one conductivity type, a luminescent element having a diffusion layer of the opposite conductivity type to emit a light from one surface of said diffusion layer and an electrode for said element, the electrode having an elongated contact portion in contact with one end portion of said surface of said diffusion layer, a lead take-out portion and restricting means electrically connected between said contact portion and lead take-out portion and serving to restrict a flow of impurity from said contact portion to said take-out portion.

2. A semiconductor luminescent display apparatus according to claim 1, wherein said restricting means has a neck portion narrower than the lead take-out portion.

3. A semiconductor luminescent display apparatus according to claim 2, wherein said semiconductor substrate is an n-type gallium phosphide substrate and said diffusion layer is a p-type gallium phosphide layer.

4. A semiconductor luminescent display apparatus according to claim 3, wherein said neck portion has a width T given as following relationship $$L/100 < T < L/4$$

where L is the entire length or longitudinal dimension of the luminescent surface of said diffusion layer.

5. A semiconductor luminescent display apparatus comprising an insulating header, a plurality of semiconductor luminescent devices arranged in a row on one surface of said header, each said semiconductor luminescent device including a plurality of luminescent segments each having a luminescent surface formed on one side of the semiconductor substrate, first electrodes each having a contact surface in contact with one end side of said luminescent surface in the longitudinal direction thereof and second electrodes formed on the other side of said semiconductor substrate and mounted on said header and drive means connected to said individual electrodes to selectively drive the luminescent segments for luminescence thereof.

6. The semiconductor luminescent display apparatus according to claim 5, wherein said semiconductor luminescent devices are arranged in a row on the central portion of the header surface, the substrate of said devices having one side formed with the luminescent surface of each said luminescent segment and the other side formed with said second electrodes, and said drive means includes a plurality of conductive strips mounted on the header and extending on opposite sides of said semiconductor substrate along the row of the semiconductor luminescent device and said first electrodes having lead take-out portions positioned on the ends of said surface of the semiconductor substrate on the sides provided with said conductive strips.

7. The semiconductor luminescent display apparatus according to claim 6, wherein each said first electrode includes a contact surface and a neck portion provided between said lead take-out portion and contact surface.

* * * * *